(12) United States Patent
Lee et al.

(10) Patent No.: US 7,371,695 B2
(45) Date of Patent: May 13, 2008

(54) USE OF TEOS OXIDES IN INTEGRATED CIRCUIT FABRICATION PROCESSES

(75) Inventors: Tai-Peng Lee, Milpitas, CA (US); Barbara Haselden, Cupertino, CA (US)

(73) Assignee: ProMos Technologies Pte. Ltd., Singapore (SG)

( * ) Notice: Subject to any disclaimer, the term of this patent is extended or adjusted under 35 U.S.C. 154(b) by 116 days.

(21) Appl. No.: 11/326,547

(22) Filed: Jan. 4, 2006

(65) Prior Publication Data

US 2007/0155189 A1    Jul. 5, 2007

(51) Int. Cl.
*H01L 21/311* (2006.01)
*H01L 21/316* (2006.01)

(52) U.S. Cl. .................. 438/756; 438/751; 438/763; 438/787

(58) Field of Classification Search .............. 438/749, 438/750, 751, 756, 761, 763, 778, 787
See application file for complete search history.

(56) References Cited

U.S. PATENT DOCUMENTS

| | | | | |
|---|---|---|---|---|
| 5,271,972 A * | 12/1993 | Kwok et al. | ................ | 427/579 |
| 5,362,526 A * | 11/1994 | Wang et al. | ................ | 427/573 |
| 5,554,570 A * | 9/1996 | Maeda et al. | ................ | 438/763 |
| 5,643,838 A * | 7/1997 | Dean et al. | ................ | 438/789 |
| 5,814,377 A * | 9/1998 | Robles et al. | ................ | 427/579 |
| 5,817,566 A * | 10/1998 | Jang et al. | ................ | 438/424 |
| 5,926,722 A * | 7/1999 | Jang et al. | ................ | 438/424 |
| 5,989,977 A * | 11/1999 | Wu | ................ | 438/431 |
| 6,020,091 A | 2/2000 | Lee | | |
| 6,043,136 A * | 3/2000 | Jang et al. | ................ | 438/424 |
| 6,048,406 A * | 4/2000 | Misra et al. | ................ | 134/2 |
| 6,083,569 A * | 7/2000 | Gupta et al. | ................ | 427/535 |
| 6,107,214 A * | 8/2000 | Iyer | ................ | 438/787 |
| 6,149,974 A * | 11/2000 | Nguyen et al. | ........ | 427/255.29 |
| 6,165,854 A * | 12/2000 | Wu | ................ | 438/296 |
| 6,319,324 B1 * | 11/2001 | Nguyen et al. | ............ | 118/697 |
| 6,449,521 B1 * | 9/2002 | Gupta | ................ | 700/121 |
| 6,545,588 B1 | 4/2003 | Wicks et al. | | |
| 6,682,996 B1 | 1/2004 | Blosse | | |
| 6,762,127 B2 * | 7/2004 | Boiteux et al. | ............ | 438/702 |
| 6,784,122 B2 * | 8/2004 | Iyer | ................ | 438/787 |
| 6,864,561 B2 * | 3/2005 | Iyer et al. | ................ | 257/634 |
| 7,101,815 B2 * | 9/2006 | Iyer | ................ | 438/787 |
| 2004/0000694 A1 | 1/2004 | Johnson | | |
| 2005/0026338 A1 | 2/2005 | Reber et al. | | |
| 2005/0048222 A1 | 3/2005 | Ruelke et al. | | |

OTHER PUBLICATIONS

Spierings, Review, Wet chemical Etching of Silicate Glasses in Hydrofluoric Acid Based Solutions, Journal of Materials Science, vol. 28 (1993), pp. 6261-6273.*
Bull. Mater. Sci., "Electrical Characterization of Low Temperature Deposited Oxide films on ZnO/*n*-Si Substrate," vol. 26, No. 7, Dec. 2003, pp. 693-697.

* cited by examiner

*Primary Examiner*—M. Wilczewski
(74) *Attorney, Agent, or Firm*—Michael Shenker; MacPherson Kwok Chen & Heid LLP

(57) ABSTRACT

A method for manufacturing a low temperature removable silicon dioxide hard mask for patterning and etching is provided, wherein tetra-ethyl-ortho-silane (TEOS) is used to deposit a silicon dioxide hard mask.

12 Claims, 3 Drawing Sheets

USE OF TEOS OXIDES IN INTEGRATED CIRCUIT FABRICATION PROCESSES

FIELD OF THE INVENTION

The present invention relates to the fabrication of integrated circuits, and more particularly, to the use of TEOS oxides in integrated circuit fabrication processes.

BACKGROUND OF THE INVENTION

In the manufacture of semiconductor devices, a variety of conductive device regions and layers are formed on a device substrate. Photolithography is employed to define patterns making up device regions in the various layers. A lithographic system consists of a radiation source, a resist-coated sample and an image control system that regulates which part of the sample is illuminated by the radiation and which is not, according to a pattern. Selected portions of the resist are exposed by irradiating them with light of a selected wavelength. Depending on the type of resist, the exposed (positive tone process) or the unexposed (negative tone process) resist can be removed selectively by a developing process. The pattern is then inscribed into the resists and can be transferred to the sample by a subsequent process step, e.g., an etching step.

A photoresist patterned over a layer and the regions bared upon exposure are typically removed by an etch such as a plasma etch or ion bombardment. However, the resist mask also may degrade during the plasma etch of the underlying material, reducing resolution of the image patterned into the dielectric layer. Such imperfect image transfer compromises the performance of the semiconductor device.

Certain inorganic materials known as hard masks have been interposed between dielectric and resist layers to reduce imperfections in image transfer from the resist layer to the underlying dielectric layer. The hard mask material, e.g. silicon dioxide, may be deposited via chemical vapor deposition (CVD) using organic precursors such as silane or tetra-ethyl-ortho-silane (TEOS) and oxygen. A photoresist is then coated and imaged over the hard mask. The inorganic hard mask regions bared upon resist development are removed by a plasma etch to which the organic resist layer is resistant. Relatively high etch selectivity can be achieved between the inorganic hard mask layer and the overcoated patterned organic-based resist.

Upon such etching, the hard mask profile matches the resist mask. Regions exposed upon hard mask etching such as polysilicon now can be removed by an etchant for which the hard mask is resistant. The hard mask can then be removed by a separate etchant. Because high etch selectivity can be realized between the underlying layer material (such as polysilicon) and the hard mask, image transfer imperfections as discussed above can be avoided. See generally U.S. Pat. Nos. 6,890,448, 5,468,342, and 5,346,586.

One problem encountered in the conventional removal of hard masks made of silicon dioxide is that etchants such as hydrofluoric acid (HF) remove not only the silicon dioxide hard mask, but also tend to remove exposed portions of high-density plasma (HDP) field isolation silicon dioxide between adjacent transistors. This is because the etch rates for the hard mask oxide and the field oxide are comparable. Removing portions of the HDP field oxides undesirably reduces the isolation between the transistors. What is needed therefore is a method of forming and removing silicon dioxide hard masks that minimizes the undesirable removal of field isolation oxides, by maximizing the difference in etch rates between the hard mask oxides and the HDP field oxides.

SUMMARY OF THE INVENTION

The present invention provides a method for forming a silicon dioxide hard mask that can be etched at a faster rate than HDP field oxide can be etched. In one embodiment, the invention calls for depositing a $SiO_2$ hard mask at a low temperature of preferably 200 degrees Celsius or below using a TEOS precursor. The resulting hard mask has the property that when wet-etched by an etchant such as HF, the hard mask is etched faster than the HDP field dioxide used in the isolation trench oxide.

DETAILED DESCRIPTION OF THE EMBODIMENTS

In this description, it will be understood that when an element such as a layer, film, region, substrate, or panel is referred to as being "on" another element, it can be directly on the other element or intervening elements may also be present. In contrast, when an element is referred to as being "directly on" another element, there are no intervening elements present. Note also that the thicknesses of the figures are not drawn to scale, and should not be interpreted as limiting the invention to the disclosed embodiments.

Figure 1:
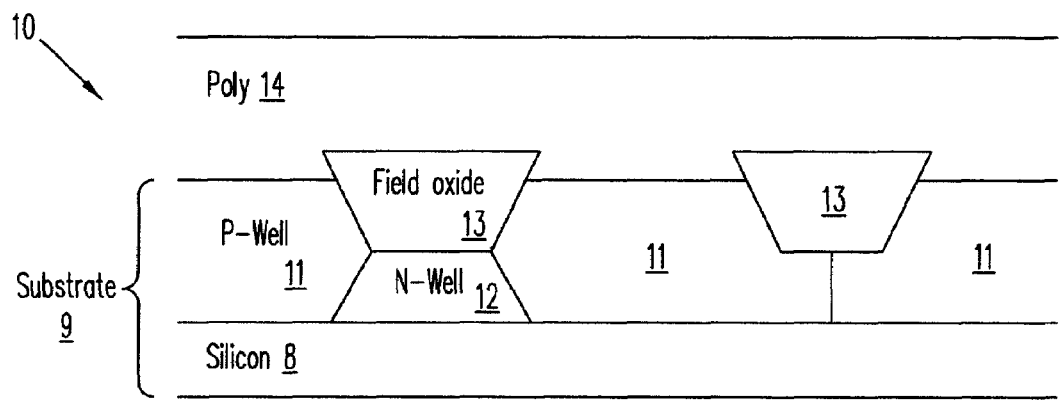
FIGS. 1-6 show various stages of processing a semiconductor device according to the present invention.

Referring now to the figures, a method for forming a removable hardmask according to the present invention will be described. FIG. 1 shows a stage in the manufacture of a conventional semiconductor device (10) comprising a semiconductor substrate (9) such as monocrystalline silicon (8). P-wells (11) and N-wells (12) have been formed in substrate (9). A field dielectric (13) can be formed by shallow trench isolation (STI), to include a top layer of silicon dioxide formed by a high density plasma (HDP) process. Silane and oxygen can be the precursors in the HDP process, and the deposition temperature can be around 650 degrees Celsius. Dielectric (13) can also be formed from thermally grown silicon dioxide by the LOCOS process or other processes. In one embodiment, the field dielectric (13) may have a thickness of about 2200 Angstroms.

Figure 6:
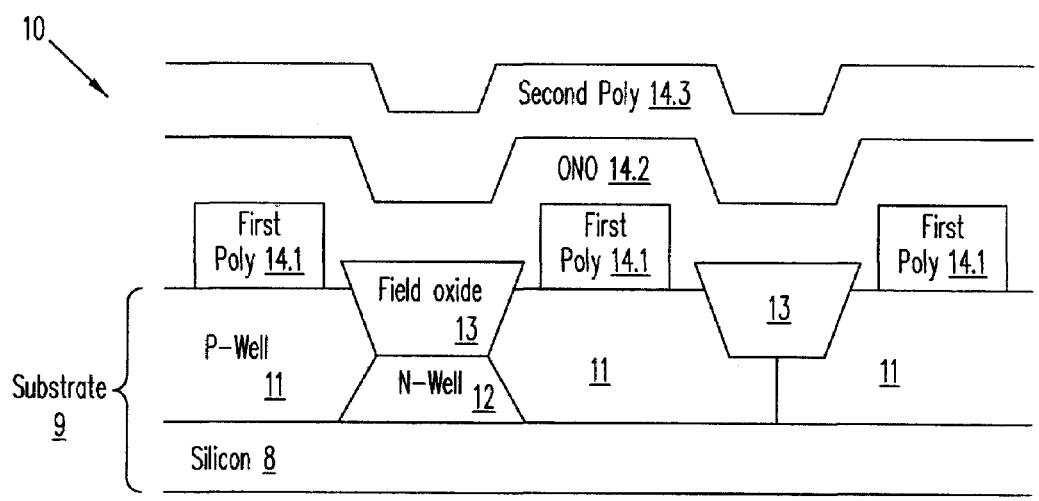

Next, a layer (14) is deposited, and will later be patterned using a hard mask. In one embodiment, the layer (14) is a polysilicon or metal layer, or a stack of layers, e.g. a first (bottom) polysilicon layer, an oxide-nitride-oxide (ONO) layer, and a second (top) polysilicon layer. FIG. 6 shows a number of polysilicon features (e.g. floating gates) formed from first polysilicon (14.1) over active areas of substrate (9). ONO (14.2) is formed on the polysilicon gates (14.1) and field oxide regions (13). Second polysilicon (14.3) (e.g. to provide memory wordlines) is formed on ONO (14.2) over the floating gates (14.1) and the field oxide (13).

Figure 2:
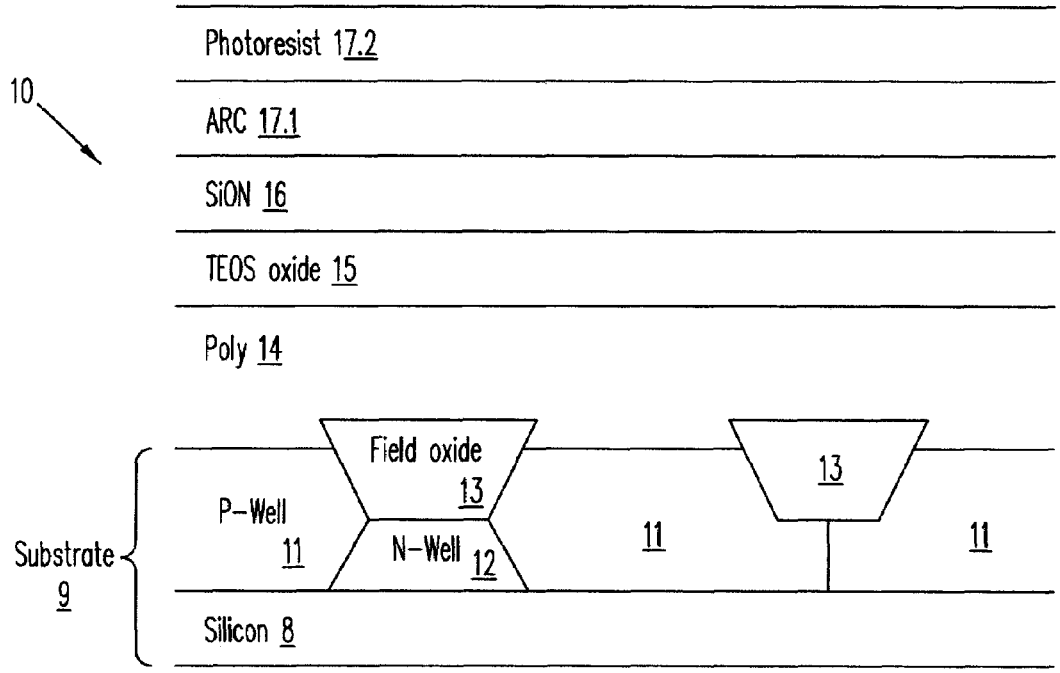

Next, to pattern the layer (14) (which may include the stack 14.1, 14.2, and 14.3 of FIG. 6), a $SiO_2$ hard mask layer (15) is utilized as shown in FIG. 2. FIG. 2 shows a hardmask $SiO_2$ film (15) formed by plasma-enhanced chemical vapor deposition (CVD) using a TEOS (i.e., $Si(C_2H_5)_4$) precursor at relatively low temperatures of 150-250 degrees Celsius:

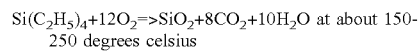

$Si(C_2H_5)_4 + 12O_2 => SiO_2 + 8CO_2 + 10H_2O$ at about 150-250 degrees celsius In an embodiment, the deposition is performed at about 200 degrees Celsius, the flow rate of TEOS is about 2.2 standard liters per minute (slm), and the oxygen flow rate is about 9 slm.

The resulting TEOS oxide layer (15) is highly porous. In one embodiment, the thickness of the TEOS oxide layer is 2000 Angstroms.

Figure 3:
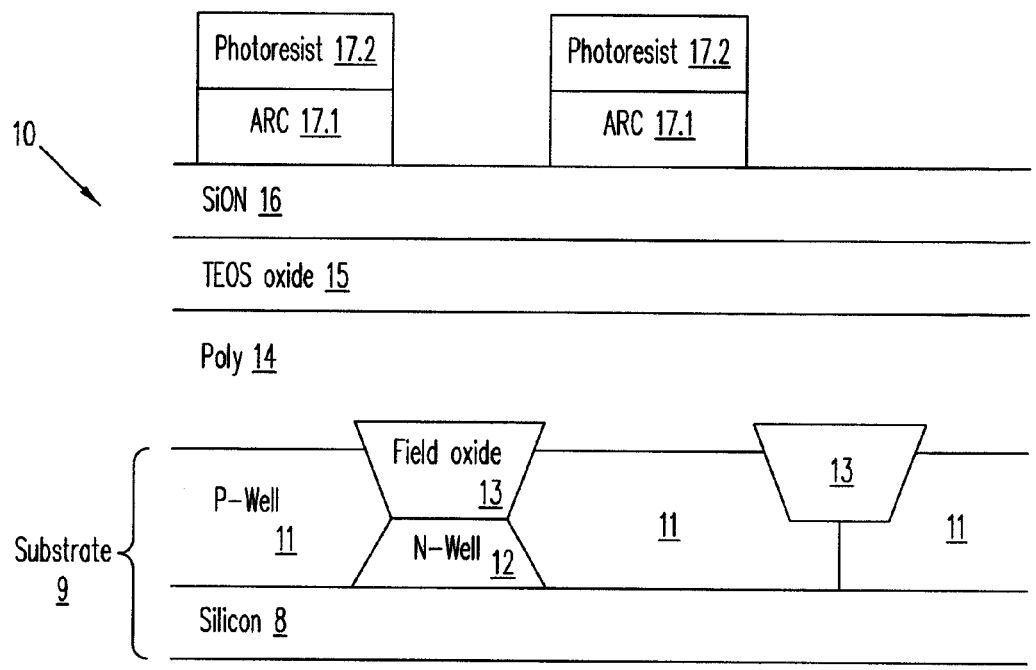

A silicon oxynitride (SiON) layer (16), anti-reflective coating (ARC) layer (17.1), and photoresist layer (17.2) are subsequently deposited on the TEOS oxide layer as shown in FIG. 2. The ARC (17.1) and SiON (16) layers under the photoresist (17.2) act to minimize the critical dimension non-uniformity across the cell array during photolithographic processing by reducing the substrate reflectivity. The ARC (17.1) may be, for example, an organic spin-on ARC. Photoresist (17.2) is patterned photolithographically as shown in FIG. 3, and dry etching removes the exposed portions of the SiON layer (16) and TEOS oxide (15). The TEOS oxide (15) will act as a hard mask for the dry etch of layer (14). Resist (17.2) can be removed before the etch of layer (14) as shown in FIG. 4, or can be left in the structure and removed after the etch of layer (14).

Figure 4:
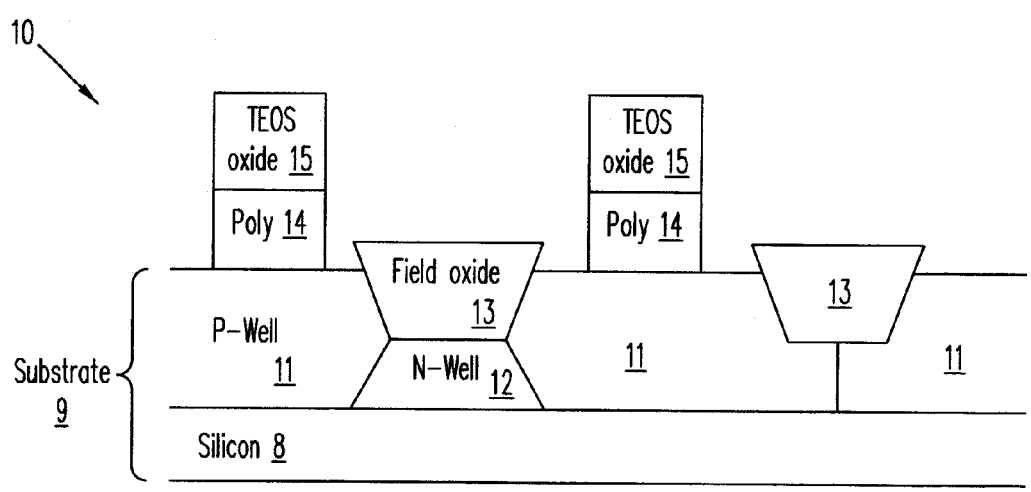

Next, portions of the layer (14) left exposed by the hard mask oxide (15) are dry etched (FIG. 4). In one embodiment, layer (14) is a polysilicon stack comprising two layers of polysilicon that sandwich an ONO (oxide-nitride-oxide) layer. (See, for example, FIG. 6.) The ONO layer may be dry etched with typical oxide etch chemistries such as $CF_4$/$CHF_3$ gas chemistry, which may also etch a substantial portion of the hard mask oxide (15). In the multi-layer polysilicon stack embodiment, up to 75% of the hard mask (15) is removed during etching of layer (14) (removal not shown in FIG. 4). In this case, removal of portions of the hard mask (15) concurrently with the ONO in layer (14) further minimizes loss of the field oxide (13) during subsequent wet etching, since there will be less hard mask (15) remaining after the dry etch.

Figure 5:
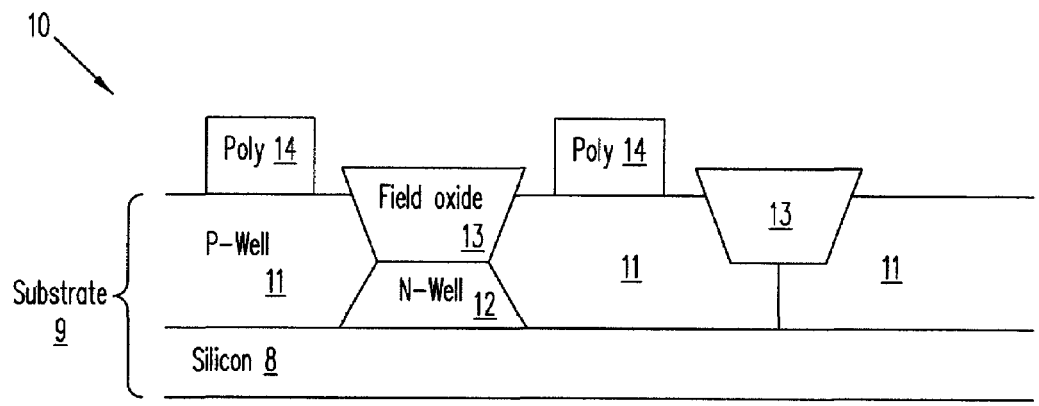

Once layer (14) is removed by dry etching, the field oxide (13) is exposed. Finally, to remove the hard mask (15), an agent such as dilute 100:1 hydrofluoric acid (HF) (i.e., 100 parts water to 1 part HF) is used to wet etch the hardmask, as shown in FIG. 5.

In one embodiment, a 100:1 HF agent etches the porous TEOS oxide layer (15) formed at 200 degrees Celsius at a rate of about 350 Angstroms/minute. In contrast, the 100:1 HF agent etches the HDP $SiO_2$ layer (13) at a rate of only about 48.3 Angstroms/minute. Thus the TEOS oxide layer is etched 7 times faster than the HDP $SiO_2$ layer. This difference in the etching rates allows selective etching whereby the TEOS oxide layer is removed quickly, while undesirable loss of the field oxide layer (13) is minimized. The decreased wet etch time also helps reduce tunnel oxide loss and oxide-nitride-oxide (ONO) undercut in the remaining portions of layer (14).

In addition to minimizing the undesirable loss of field oxide (13), a further advantage of the present invention is that the dry etch rate for oxide hard masks formed at about 200 degrees Celsius is nevertheless similar to the dry etch rate for conventional oxide hard masks formed at higher temperatures. Hence, the dry etch rates and film compositions for layer 14 in some embodiments of the present invention are similar to those of conventional methods, and therefore the by-products of dry-etching necessary for sidewall passivation (such as CFx) are also similar, leading to similar profile and selectivity control. Combining the invention with prior art dry etching processes is therefore simplified in some embodiments.

Note that various modifications to the embodiments disclosed herein are also within the scope of the present invention. For example, various substitutes for the 100:1 HF wet dip etchant can be employed, such as 100:1 buffered oxide etchant (BOE). Furthermore, the invention is not limited to a 100:1 concentration, as greater or lesser concentrations may be used without deviating from the spirit of the invention. The field oxide layers can be formed by processes other than a high-density plasma process. The invention is not limited to the field oxide being exposed when the hard mask is being removed, or to other structural features described above. The invention is not limited to the particular processes or process parameters. The invention is defined by the appended claims.

What is claimed is:

1. A method for manufacturing an integrated circuit, the method comprising:

forming a first layer comprising silicon oxide;

forming a second layer comprising silicon oxide by chemical vapor deposition from TEOS at a wafer temperature of at most 200 degrees Celsius, wherein the first layer is formed at a higher wafer temperature than the second layer;

etching the second layer selectively to the first layer by a wet etchant comprising HF.

2. The method of claim 1 wherein the first layer comprises field isolation for isolating active areas of a semiconductor substrate.

3. The method of claim 1 wherein the wafer temperature is at least 150 degrees Celsius during the chemical vapor deposition from TEOS.

4. A method for manufacturing a semiconductor device, the method comprising:

providing a semiconductor substrate;

forming a first layer on the semiconductor substrate;

depositing a TEOS silicon oxide layer on the semiconductor substrate by chemical vapor deposition (CVD) from tetra-ethyl-ortho-silicate (TEOS) at a temperature from about 150 degrees to about 250 degrees Celsius;

wherein the first layer comprises silicon oxide or silicon oxynitride, and the method further comprises:

etching the TEOS silicon oxide layer selectively to the first layer with a wet etchant, wherein the first layer is exposed to the etchant during at least part of the etching operation;

depositing a second layer under the TEOS silicon oxide layer;

depositing a photoresist layer on the TEOS silicon oxide layer;

patterning the photoresist layer;

etching the TEOS silicon oxide layer exposed by the patterned photoresist;

etching the second layer exposed by the etched TEOS silicon oxide layer;

depositing a silicon oxy-nitride (SiON) layer on the TEOS silicon oxide layer; and depositing an organic anti-reflective coating (ARC) layer on the SiON layer;

wherein the photoresist layer is deposited on the organic ARC layer.

5. The method of claim 4, wherein the TEOS silicon oxide layer is deposited on the first layer.

6. The method of claim 4, wherein the wet etchant comprises hydrofluoric acid (HF).

7. The method of claim 6, wherein the HF is diluted with water at a ratio of 100 parts water to 1 part HF.

8. The method of claim 4, wherein the wet etchant comprises buffered oxide etchant (BOE).

9. The method of claim 8, wherein the buffered oxide etchant is diluted with water at a ratio of 100 parts water to 1 part BOE.

10. The method of claim 4, further comprising etching the SiON layer and the organic ARC layer.

11. The method of claim 4, wherein the second layer comprises a second polysilicon layer on an oxide-nitride-oxide or silicon oxide layer.

12. The method of claim 11, further comprising forming a first polysilicon layer under the oxide-nitride-oxide or silicon oxide layer, wherein the first polysilicon layer is selectively pre-etched and exposes portions of the first layer.

* * * * *